United States Patent
Jung et al.

(10) Patent No.: US 11,289,686 B2
(45) Date of Patent: Mar. 29, 2022

(54) BONDING APPARATUS AND METHOD OF BONDING A DISPLAY DEVICE USING THE SAME

(71) Applicant: SAMSUNG DISPLAY CO., LTD., Yongin-si (KR)

(72) Inventors: Sukwon Jung, Cheonan-si (KR); Seokhyun Nam, Seoul (KR); Jongdeok Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 229 days.

(21) Appl. No.: 16/409,065

(22) Filed: May 10, 2019

(65) Prior Publication Data
US 2019/0348641 A1 Nov. 14, 2019

(30) Foreign Application Priority Data
May 11, 2018 (KR) .................... 10-2018-0054453

(51) Int. Cl.
*H01L 51/56* (2006.01)
*B29C 65/52* (2006.01)
(Continued)

(52) U.S. Cl.
CPC ............ *H01L 51/56* (2013.01); *B29C 65/52* (2013.01); *B29C 66/301* (2013.01);
(Continued)

(58) Field of Classification Search
CPC ......... H01L 51/5246; H01L 2251/5338; H01L 51/5237; H01L 51/56; B29C 66/301;
(Continued)

(56) References Cited

U.S. PATENT DOCUMENTS

| 10,018,774 B2 | 7/2018 | Kim et al. |
| 2013/0032288 A1 | 2/2013 | Lien et al. |

(Continued)

FOREIGN PATENT DOCUMENTS

| KR | 10-0951598 | 3/2010 |
| KR | 10-0990859 | 10/2010 |

(Continued)

*Primary Examiner* — George R Koch
*Assistant Examiner* — Jimmy R Smith, Jr.
(74) *Attorney, Agent, or Firm* — F. Chau & Associates, LLC

(57) ABSTRACT

A bonding apparatus includes adhesive sheet that includes a central adhesive portion adhered to a central portion of a first substrate and a bendable adhesive portion that surrounds the central adhesive portion in a plan view and that is adhered to an edge portion of the first substrate that extends from the central portion, a molding member that includes a top surface that overlaps the central portion and a side surface bent from the top surface and that has a curved shape and that supports the adhesive sheet through the top surface, a magnet member disposed on a first display surface of a second substrate that covers the central portion of the first substrate, and pressing balls disposed in the molding member. The pressing balls press fife central adhesive portion and the bendable adhesive portion by forming attractive force with magnet member.

13 Claims, 11 Drawing Sheets

(51) Int. Cl.
   *H01L 51/52* (2006.01)
   *B29C 65/00* (2006.01)
   *B29L 31/34* (2006.01)
(52) U.S. Cl.
   CPC ........ *B29C 66/816* (2013.01); *H01L 51/5237* (2013.01); *B29L 2031/3475* (2013.01)
(58) Field of Classification Search
   CPC .............. B29C 66/816; B29C 65/4825; B29C 65/5057; B29C 65/52; B29C 65/7841; B29C 66/1122; B29C 66/344; B29C 66/345; B29C 66/545; B29C 66/7392; B29C 66/7394; B29C 66/8362; B29L 2031/3475; G06F 1/1626
   See application file for complete search history.

(56) References Cited

U.S. PATENT DOCUMENTS

| | | |
|---|---|---|
| 2013/0091999 A1 | 4/2013 | Green et al. |
| 2014/0092356 A1 | 4/2014 | Ahn et al. |
| 2016/0288137 A1 | 10/2016 | Rem et al. |
| 2016/0318293 A1* | 11/2016 | Kim .................... B32B 38/1841 |
| 2017/0199548 A1* | 7/2017 | Kim ...................... B29C 66/814 |
| 2017/0205568 A1 | 7/2017 | Jeon et al. |
| 2017/0232633 A1 | 8/2017 | Green et al. |

FOREIGN PATENT DOCUMENTS

| | | |
|---|---|---|
| KR | 1020130037033 | 4/2013 |
| KR | 1020140043968 | 4/2014 |
| KR | 1020170084414 | 7/2017 |
| KR | 1020170086169 | 7/2017 |
| KR | 1020170086170 | 7/2017 |
| KR | 20180013370 A * | 2/2018 |

* cited by examiner

BONDING APPARATUS AND METHOD OF BONDING A DISPLAY DEVICE USING THE SAME

CROSS-REFERENCE TO RELATED APPLICATION

This U.S. non-provisional patent application claims priority under 35 U.S.C. § 119 from, and the benefit of, Korean Patent Application No. 10-2018-0054453, filed on May 11, 2018 in the Korean intellectual Property Office, the contents of which are herein incorporated by reference in their entirety.

BACKGROUND

Technical Field

The present disclosure herein relates to a bonding apparatus, and more particularly, to an apparatus for bonding a window member and a display module and a method of bonding a display device using the same.

Discussion of the Related Art

In general, a display device can be classified as an organic light emitting display (OLED) device, a liquid crystal display (LCD) device, an electrophoretic display (ED) device, a surface-conduction electron-emitter display (SED) device, or a vacuum fluorescent display (VFD) device.

Display devices may be used in mobile devices, such as smart phones, tablet personal computers, laptop computers, digital cameras, camcorders, or portable information terminals, and electronic products, such as televisions and billboards.

Flexible display devices have been developed with the development of portable devices having various shapes. For example, a window member that includes a flat display area and a display area bent from the flat display area has been developed. In other words, an image tiny be displayed through a front surface and a side surface of the window member.

SUMMARY

Embodiments of the present disclosure can provide an apparatus for bonding a window member and a display module using a magnet member, and a method of bonding a display device using the same.

In an embodiment of the inventive concepts, a method of bonding a display device includes providing a substrate that includes a first display surface and a second display surface that surrounds the first display surface and that is bent from the first display surface, adhering a display substrate to a front surface of an adhesive sheet, where the display substrate includes a central portion and an edge portion that extends from the central portion and surrounds the central portion in a plan view, where the adhesive sheet includes a central adhesive portion that overlaps the central portion and a bendable adhesive portion that overlaps the edge portion, disposing a molding member under the adhesive sheet, where the molding member includes a plurality of pressing balls and supports the adhesive sheet, bending the bendable adhesive portion along a side surface of the molding member using a moving member coupled to the bendable adhesive portion, inserting the display substrate into a space surrounded by the second display surface, pressing the central adhesive portion with the pressing balls, where the pressing is controlled by a magnet member disposed on the substrate, and pressing the bendable adhesive portion with the pressing balls controlled by the magnet member. The magnet member forms an attractive force with the pressing balls.

In an embodiment, the bendable adhesive portion includes a first side adhesive portion and a second side adhesive portion spaced apart from each other in a first direction with the central adhesive portion interposed therebetween, and a third side adhesive portion and a fourth side adhesive portion spaced apart from each other in a second direction that intersects the first direction with the central adhesive portion interposed therebetween.

In an embodiment, bending the bendable adhesive portion includes bending the first side adhesive portion and the second side adhesive portion, and bending the third side adhesive portion and the fourth side adhesive portion.

In an embodiment, the bendable adhesive portion furthers include a first corner adhesive portion disposed between the first side adhesive portion and the third side adhesive portion and cut from the first side adhesive portion and the third side adhesive portion, a second corner adhesive portion disposed between the first side adhesive portion and the fourth side adhesive portion and cut from the first side adhesive portion and the fourth side adhesive portion, a third corner adhesive portion disposed between the second side adhesive portion and the third side adhesive portion and cut from front the second side adhesive portion and the third side adhesive portion, and a fourth corner adhesive portion disposed between the second side adhesive portion and the fourth side adhesive portion and cut from the second side adhesive portion and the fourth side adhesive portion.

In an embodiment, bending the bendable adhesive portion further includes bending the first to fourth corner adhesive portions.

In an embodiment, the magnet n ember includes a first magnet and a second magnet, pressing the central adhesive portion with the pressing balls includes moving the first magnet toward the first side adhesive portion from the central portion of the first display surface, and moving the second magnet toward the second side adhesive portion from the central portion of the first display surface, and pressing the bendable adhesive portion with the pressing balls includes moving the first magnet onto the first side adhesive portion, and moving the second magnet onto the second side adhesive portion.

In an embodiment, the magnet member includes a first magnet and a second magnet, and pressing the central adhesive portion with the pressing balls includes moving the first magnet toward the third side adhesive portion from a central portion of the first display surface; and moving the second magnet toward the fourth side adhesive portion from the central portion of the first display surface.

In an embodiment, the magnet member may include a plurality of magnets disposed adjacent to each corner of the substrate, and pressing the central adhesive portion with the pressing balls includes moving each of the plurality of magnets toward a respective one of the first to fourth corner adhesive portions.

In an embodiment, the method further includes adhering an adhesive member to a front surface of the display substrate. The pressing balls press the adhesive sheet using the attractive force with the magnet member, such that the adhesive member is adhered to the substrate.

In an embodiment, the pressing balls include magnetic fluid that includes a ferromagnetic material.

In an embodiment, the molding member includes a pocket that overlaps the first display surface and that is filled with the pressing balls, and a plurality of guides spaced apart from each other in a plan view and coupled to corners of the pocket, respectively. Side surfaces of the guides, which face the second display surface, are curved.

In an embodiment, the second display surface, the edge portion and the side surfaces of the guides may have the same curvature.

In embodiment, the first display surface is curved.

In an embodiment of the inventive concepts, a bonding apparatus includes an adhesive sheet that includes a central adhesive portion that is adhered to a central portion of a first substrate and a bendable adhesive portion that surrounds the central adhesive portion in a plan view and is adhered to an edge portion of the first substrate that extends from the central portion, a molding member that includes a top surface that overlaps, the central portion and a side surface bent from the top surface and that has a curved shape and supports the adhesive sheet through the top surface, a magnet member disposed on a second substrate, where the second substrate includes a first display surface that covers the central portion of the first substrate and a second display surface that covers the edge portion of the first substrate, and a plurality of pressing balls disposed in an inner space of the molding member. The pressing balls can press the central adhesive portion and the bendable adhesive portion by forming an attractive force with the magnet member.

In an embodiment, the bonding apparatus further includes a plurality of guides spaced apart from each other in a plan view and coupled to corners of the molding member, respectively. The second display surface, the edge portion and side surfaces of the guides have the same curvature after the first substrate and the second substrate are bonded to each other.

In an embodiment, the bendable adhesive portion includes a first adhesive portion and a second adhesive portion spaced apart from each other in a first direction with the central adhesive portion interposed therebetween, and a third adhesive portion and a fourth adhesive portion spaced apart from each other in a second direction that intersects the first direction with the central adhesive portion interposed therebetween.

In an embodiment, the bendable adhesive portion may further include a fifth adhesive portion disposed between the first adhesive portion and the third adhesive portion and cut from the first adhesive portion and the third adhesive portion, a sixth adhesive portion disposed between the first adhesive portion and the fourth adhesive portion and cut from the first adhesive portion and the fourth adhesive portion, a seventh adhesive portion disposed between the second adhesive portion and the third adhesive portion and cut from the second adhesive portion and the third adhesive portion, and an eighth adhesive portion disposed between the second adhesive portion and the fourth adhesive portion and cut from the second adhesive portion and the fourth adhesive portion.

In an embodiment, the bonding apparatus further include a plurality of moving members coupled to the first to eighth adhesive portions, respectively, that bend the first to eighth adhesive portions from the central adhesive portion.

In an embodiment, the central portion of the first substrate and the first display surface of the second substrate are curved with the same curvature.

In an embodiment of the inventive concepts, a method of bonding a display device includes adhering an adhesive sheet to first surface of a display substrate, where the display substrate includes a central portion, an edge portion that extends from the central portion and surrounds the central portion in a plan view, and a second surface opposite the first surface, and where the adhesive sheet includes a central adhesive portion that overlaps the central portion and a bendable adhesive portion that overlaps the edge portion, bending the bendable adhesive portion along a side surface of a molding member disposed under the adhesive sheet using a moving member coupled to the bendable adhesive portion, wherein the molding member includes magnetic pressing balls, inserting the display substrate into a space under a window member that is formed by bent edge surfaces of the window member, disposing a magnet member that includes a first magnet and a second magnet over the window member, adhering the second surface of the display substrate to the window member by moving the first magnet from a central portion of the window member toward an edge of the window member, and moving the second magnet from the central portion of the window member toward an opposite edge of the window member. Each of the first and second magnets forms an attractive force with the magnetic pressing balls.

In an embodiment, the magnet member further comprises a third magnets and a fourth magnet, and adhering the second surface of the display substrate to the window member further includes moving each of the first to fourth magnets toward a respective corner of the window member.

DETAILED DESCRIPTION OF EXEMPLARY EMBODIMENTS

Figure 1A:
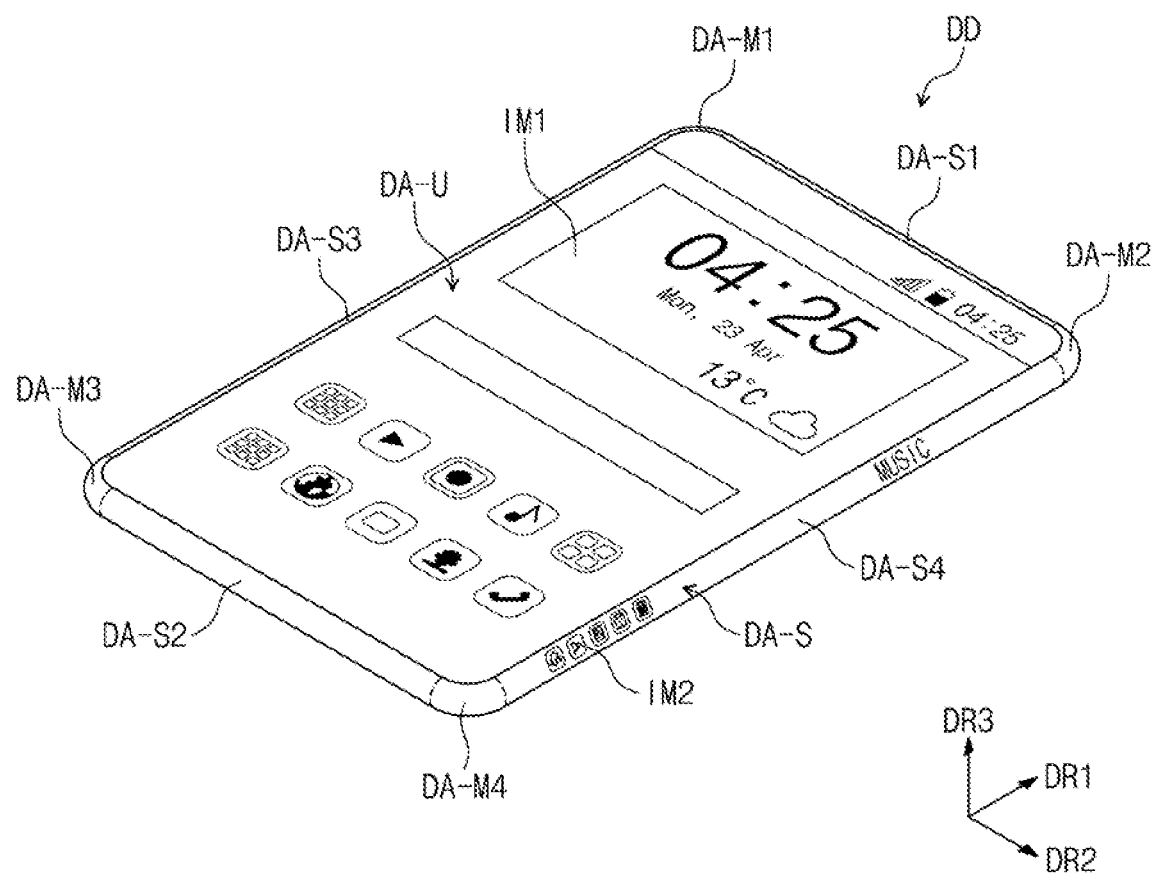
FIG. 1A is a perspective view of a display device according to an embodiment of the inventive concepts.

Exemplary embodiments of the inventive concepts now will be described more fully hereinafter with reference to the accompanying drawings, in which various embodiments are shown. Embodiments of inventive concepts may, however, take many different forms, and should not be construed as limited to exemplary embodiments set forth herein. Like reference numerals may refer to like elements throughout.

It will be understood that when an element such as a layer, region or substrate is referred to as being "on" another element, it can be directly on the other element or intervening elements may be present.

Figure 1B:
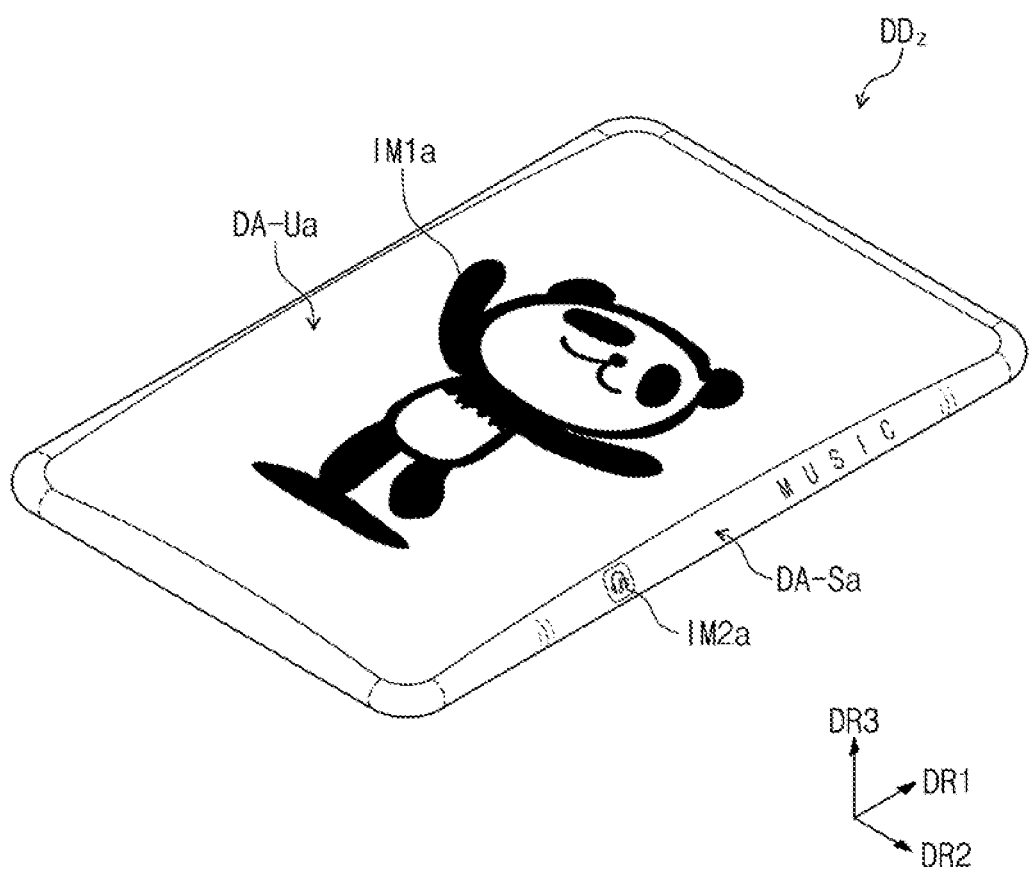
FIG. 1B is a perspective view of a display device according to an embodiment of the inventive concepts.

FIG. 1A is a perspective view of a display device according to an embodiment of the inventive concepts. FIG. 1B is a perspective view of a display device according to an embodiment of the inventive concepts.

Referring to FIG. 1A, a display device DD of a portable terminal, such as a smart phone, is illustrated as an example according to an embodiment. The display device DD may be received in a bracket/case together with electronic modules, a camera module and a power module, which are mounted on a main board, by which the portable terminal can be realized. In other embodiments, the display device DD can be incorporated into large-sized electronic devices, such as televisions and monitors, and small and middle-sized electronic devices, such as tablets, car navigation units, game consoles, or smart watches. In an embodiment, the display device DD is a flexible display device.

According to an embodiment of the inventive concepts, the display device DD includes a first display area DA-U that displays a first image IM1 through a front surface and a second display area DA-S that displays a second image IM2 through a side surface bent from the front surface. In particular, the first display area DA-U displays the first image IM1 through the entire front surface of the display device DD. The second display area DA-S displays the second image IM2 through the entire side surface of the display device DD. For example, in FIG. 1A, a time display box and application icons are illustrated as the first image IM1, and other application icons and a word are illustrated as the second image IM2.

Hereinafter, the first display area DA-U is referred to as a first display surface that corresponds to the front surface of the display device DD, and the second display area DA-S is referred to as a second display surface that corresponds to the side surface of the display device DD. In addition, a window member WM to be described below includes the first display surface and the second display surface.

In an embodiment of the inventive concepts, the first display surface has a flat shape and the second display surface has a curved shape. In other words, the second display surface is curved and is bent from the first display surface.

In an embodiment of the inventive concepts, the first display surface extends in a first direction DR1 and a second direction DR2 that intersects the first direction DR1. A normal direction to the first display surface, i.e., a thickness direction of the display device DD, is indicated by a third direction DR3. A front (or top) surface and a rear (or bottom) surface of each member or unit described hereinafter are defined by the third direction DR3. However, the first to third directions DR1, DR2 and DR3 illustrated in the present embodiment are an example of the inventive concepts, and directions indicated by the first to third directions DR1, DR2 and DR3 may be changed into other directions.

According to an embodiment of the inventive concepts, the first display surface DA-U is defined by first to fourth sides and first to fourth curved lines. In more detail, the first display surface DA-U includes the first and second sides spaced apart from each other in the first direction DR1 and that extend in the second direction DR2, and the third and fourth sides spaced apart from each other in the second direction DR2 and that extend in the first direction DR1. In addition, the first display surface DA-U includes the first curved line that connects the first and third sides, the second curved line that connects the first and fourth sides, the third curved line that connects the second and third sides, and the fourth curved line that connects the second and fourth sides. The first to fourth curved lines respectively correspond to corners of the first display surface.

However, embodiments of the inventive concepts are not limited thereto. In another embodiment, at least one of the first to fourth curved lines are omitted. In this case, two sides corresponding to the omitted curved line are connected directly to each other.

In an embodiment of the inventive concepts, the second display surface DA-S includes first to fourth side surfaces DA-S1 to DA-S4 and first to fourth corner surfaces DA-M1 to DA-M4. The first side surface DA-S1 and the second side surface DA-S2 are spaced apart from each other in the first direction DR1 and are bent from the first side and the second side, respectively. The third side surface DA-S3 and the fourth side surface DA-S4 are spaced apart from each other in the second direction DR2 and are bent from the third side and the fourth side, respectively. The first corner surface DA-M1 and the second corner surface DA M2 are bent from the first curved line and the second curved line, respectively, and the third corner surface DA-M3 and the fourth corner surface DA-M4 are bent from the third curved line and the fourth curved line, respectively.

Referring to FIG. 1B, a display device DDz according to a present embodiment includes a first display area DA-Ua that displays a first image IM1a through a front surface and a second display area DA-Sa that displays a second image IM2a through a side surface, like the display device DD illustrated in FIG. 1A. In particular, the first display area DA-Ua displays the first image IM1a through the entire front surface of the display device DDz. The second display area DA-Sa displays the second image IM2a through the entire side surface of the display device DDz. For example, in FIG. 1B, a bear image is illustrated as the first image IM1a, and application icons and a word are illustrated as the second image IM2a.

Hereinafter, the first display area DA-Ua is referred to as a first display surface that corresponds to the front surface of the display device DDz, and the second display area DA-Sa is referred to as a second display surface that corresponds to the side surface of the display device DDz.

According to an embodiment of the inventive concepts, the first display surface of the display device DDz has a curved shape and is three-dimensional, and the second display surface the display device DDz has a curved shape bent from the first display surface.

For example, according to an embodiment of the inventive concepts, the first display surface is convex in the third direction DR3 from a plane defined by the first and second directions DR1 and DR2. As a result, as illustrated in FIG. 1B, a thickness of a central portion of the second display surface is greater than those of both edge portions of the second display surface when viewed in the first direction DR1 or the second direction DR2.

However, embodiments of the inventive concepts are not limited thereto. In an embodiment, the first display surface is concave in a direction opposite to the third direction DR3 from the plane defined by the first and second directions DR1 and DR2. In an embodiment, the thickness of the second display surface is entirely uniform when viewed in a side view, and the first display surface may have a concave or convex shape.

Figure 2A:
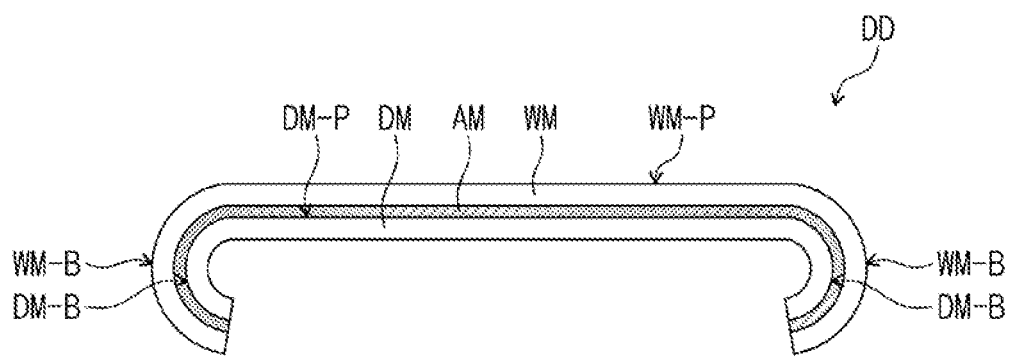
FIG. 2A is a cross-sectional view of a display device according to an embodiment of the inventive concepts.
Figure 2B:
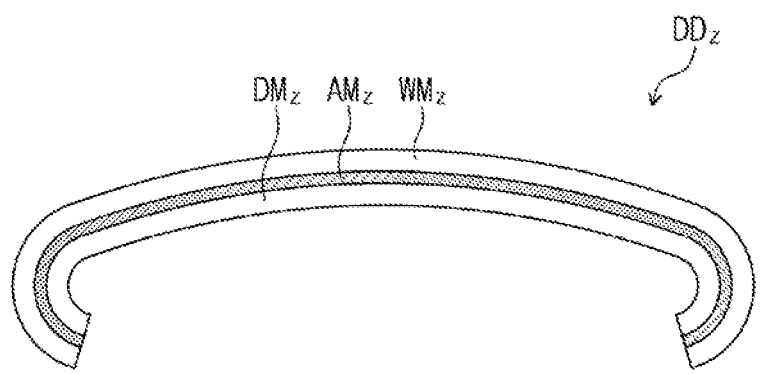
FIG. 2B is a cross-sectional view of a display device according to an embodiment of the inventive concepts.

FIG. 2A is a cross-sectional view of a display device according to an embodiment of the inventive concepts. FIG. 2B is a cross-sectional view of a display device according to an embodiment of the inventive concepts.

Referring to FIG. 2A, according to an embodiment of the inventive concepts, the display device DD includes a window member WM, an adhesive member AM, and a display module DM.

According to an embodiment of the inventive concepts, the window member WM is adhered to a front surface of the adhesive member AM. A user can view an image through the window member WM. In an embodiment, the window member WM is a substrate. The substrate may be a plastic substrate, a glass substrate, or an organic/inorganic composite substrate. Alternatively, the substrate is a stack structure that includes a plurality of insulating layers. The plastic substrate includes at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

According to an embodiment of the inventive concepts, the adhesive member AM is disposed between the window member WM and the display module DM. The adhesive member AM is a double-sided adhesive and fixes the window member WM and the display module DM. For example, the adhesive member AM may be an optically clear adhesive (OCA) film, an optically clear resin (OCR), or a pressure sensitive adhesive (PSA) film.

According to an embodiment of the inventive concepts, the display module DM is adhered to a rear surface of the adhesive member AM. The display module DM includes a display panel that outputs an image and an input sensing unit that senses an external input. The display panel may be, but is not limited to, a light emitting, type display panel. For example, the display panel may be an organic light emitting display panel or a quantum-dot light emitting display panel. An organic light emitting display panel includes a light emitting layer that includes an organic light emitting material. A quantum-dot light emitting display panel includes a light emitting layer that includes quantum dots or quantum rods. Hereinafter, an organic light emitting display panel will be described as an example of a display panel.

According to an embodiment of the inventive concepts, the input sensing unit senses an external input. For example, the external input can be a user's finger touch. An external input can take various forms. For example, the external input includes at least one of various external inputs, such as a part of a user's body, such as a finger, a stylus pen, light, heat, or pressure. In addition, the external input can include an approaching spatial touch, such as a hovering touch, as well as the touch of a user's body part. According to an embodiment of the inventive concepts, the display module DM is a display substrate, and the display substrate may be a bendable, flexible substrate.

According to an embodiment of the inventive concepts, each of the window member WM, the adhesive member AM and the display module DM includes a central portion and an edge portion bent from the central portion. The central portion and the edge portion overlap with the first display area DA-U and the second display area DA-S of FIG. 1A, respectively. In particular, the central portion corresponds to the first display area DA-U and is flat, and the edge portion corresponds to the second display area DA-S and is bent from the central portion to have a curved shape.

As illustrated in FIG. 2A, according to an embodiment of the inventive concepts, the window member WM includes a first flat portion WM-P and a first edge portion WM-B. The first flat portion WM-P corresponds to the central portion of the window member WM. The first edge portion WM-B is bent from the first flat portion WM-P and corresponds to the edge portion of the window member WM. The display module DM includes a second flat portion DM-P and a second edge portion DM-B. The second flat portion DM-P corresponds to the central portion of the display module DM. The second edge portion DM-B is bent from the second flat portion DM-P and corresponds to the edge portion of the display module DM.

Referring to FIG. 2B, according to an embodiment of the inventive concepts, the display device DDz includes a window member WMz, an adhesive member AMz, and a display module DMz. A shape of a central portion of the display device DDz of FIG. 2B differs from the shape of the central portion of the display device DD of FIG. 2A.

According to an embodiment of the inventive concepts, in more detail, central portions of the window member WMz, the adhesive member AMz and the display module DMz, which overlap with the first display area DA-Ua of FIG. 1B, are curved. In other words, both the central portion and the edge portion of each of the window member WMz and the display module DMz have a curved shape.

Referring again to FIG. 2A, according to an embodiment of the inventive concepts, the display module DM and the window member WM are coupled to each other by the adhesive member AM, as described above. First, the adhesive giber AM is adhered to the front surface of the display module DM. Thereafter, the adhesive member AM, which is adhered to the front surface of the display module DM, is adhered to the rear surface of the window member WM.

However, according to an embodiment of the inventive concepts, since the first edge portion WM-B of the window member WM is bent from the first flat portion WM-P, the adhesive member AM may not be accurately positioned the rear surface of the window member WM.

A bonding apparatus according to an embodiment of the inventive concepts can easily bond the window member WM and the display module DM by using a molding member that includes a magnet and magnetic pressing balls.

Figure 3:
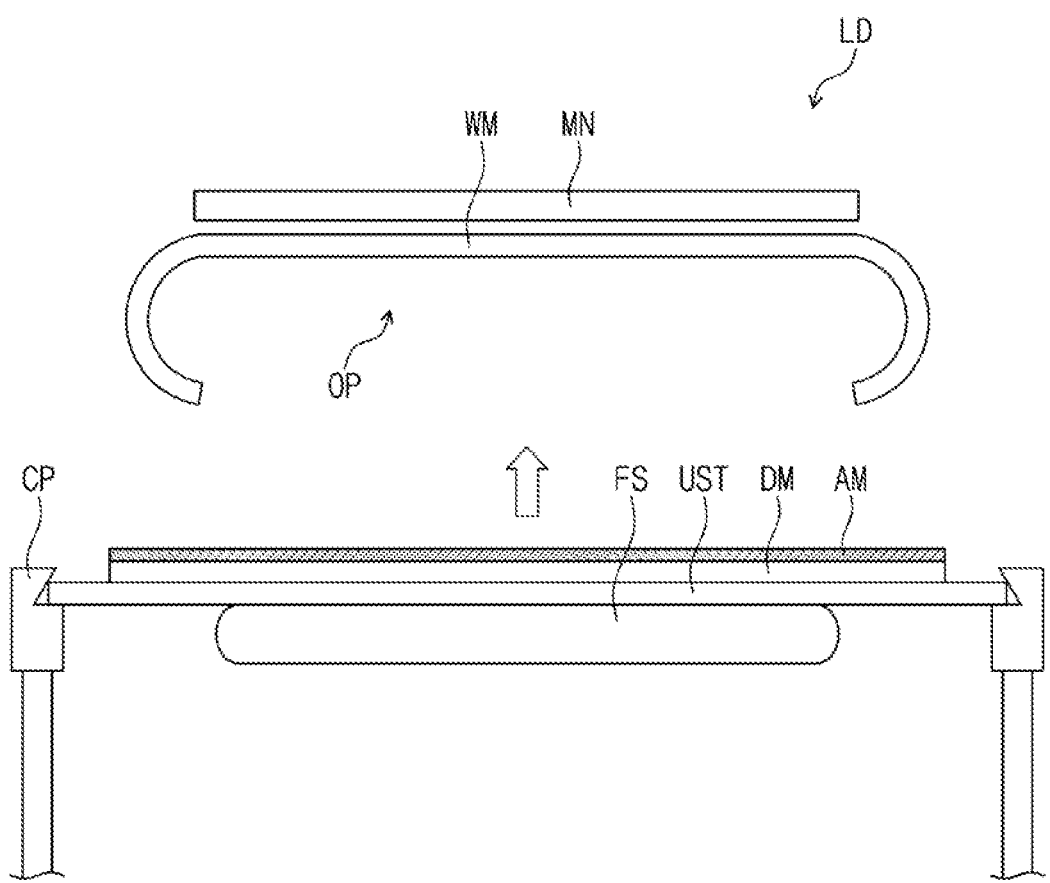
FIG. 3 is a cross-sectional view of a bonding apparatus according to an embodiment of the inventive concepts.
Figure 4:
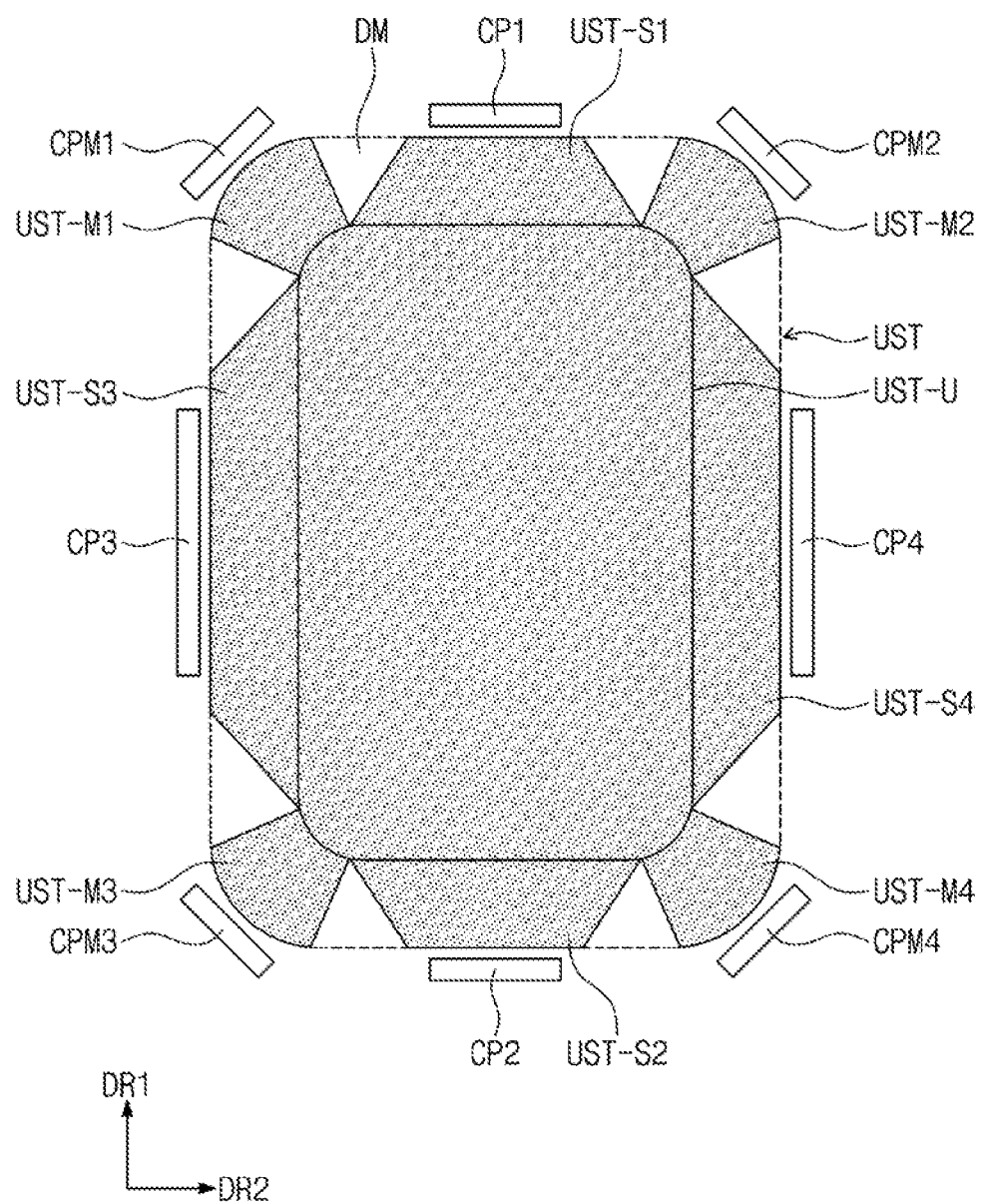
FIG. 4 is a plan view of an adhesive sheet of FIG. 3.
Figure 5:
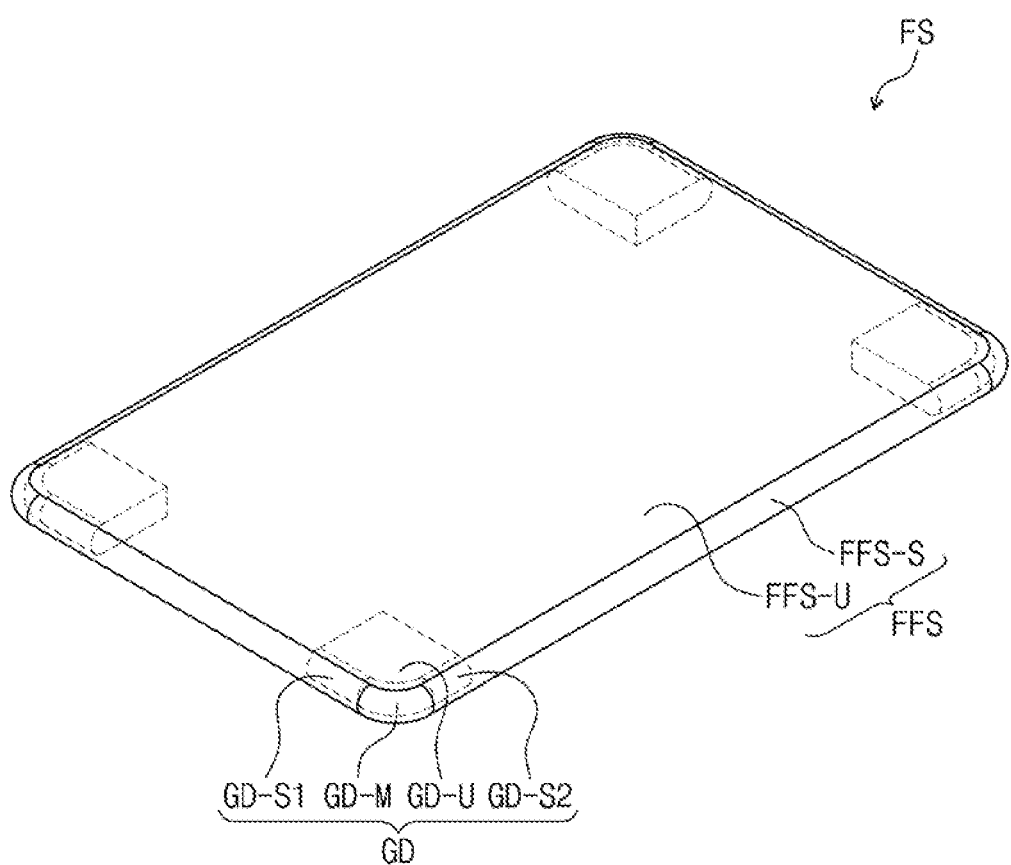
FIG. 5 is a perspective view of a molding member of FIG. 3.

FIG. 3 is a cross-sectional view of a bonding apparatus according to an embodiment of the inventive concepts. FIG. 4 is a plan view of an adhesive sheet of FIG. 3. FIG. 5 is a perspective view of a molding member of FIG. 3.

A bonding apparatus LD according to an embodiment of the inventive concepts can be used to bond two substrates, each of which has a flat portion and an edge portion bent from the flat portion, as described with reference to FIG. 2A. Hereinafter, an embodiment of a bonding apparatus will be described as applied to the display device DD of FIG. 2A. However, embodiments of the inventive concepts are not limited thereto. An embodiment of a bonding apparatus an also be applied to the display device DDz of FIG. 2B.

In an embodiment, the display module DM and the adhesive member AM disposed on the display module DM are disposed over art inner space OP surrounded by the first edge portion SM-B (see FIG. 2A) of the window member WM. In other words, the display module DM and the adhesive member AM are bent by the bonding apparatus LD and then bonded to the window member WM.

Referring to FIG. 3, according to an embodiment of the inventive concepts, the bonding apparatus LD includes a magnet member MN, a molding member FS, an adhesive sheet UST, and a moving member CP.

According to an embodiment of the inventive concepts, the magnet member MN is disposed on the window member WM. For example, the magnet member MN can be disposed adjacent to the front surface of the window member WM or can be disposed directly on the window member WM.

According to an embodiment of the inventive concepts, the adhesive sheet UST is adhered to a bottom surface, i.e., the rear surface, of the display module DM. An adhesive is applied to a front surface of the adhesive sheet UST. The display module DM is fixed to the adhesive sheet UST by the adhesive applied to the front surface of the adhesive sheet UST. In an embodiment, the adhesive of the adhesive sheet UST includes a material hardened by ultraviolet (UV) light. In another embodiment, the adhesive sheet UST is provided in another type such as a film.

Referring to FIG. 4, according to an embodiment of the inventive concepts, the adhesive sheet UST includes a central adhesive portion UST-U and a bendable adhesive portion that extends from the central adhesive portion UST-U. The second flat portion DM-P of the display module DM is adhered to the central adhesive portion UST-U, and the second edge portion DM-B of the display module DM is adhered to the bendable adhesive portion. In particular, the bendable adhesive portion of the adhesive sheet UST includes an area that is adhered to the display module DM, and an area that is connected to the moving member CP and does not overlap the display nodule DM.

In detail, according to an embodiment of the inventive concepts, the bendable adhesive portion UST includes first to fourth side adhesive portions UST-S1 to UST-S4 and first to fourth corner adhesive portions UST-M1 to UST-M4.

According to an embodiment of the inventive concepts, the first to fourth side adhesive portions UST-S1 to UST-S4 are adhered to bottom surfaces of portions of the second edge portion DM-B that overlap the first to fourth side surfaces DA-S1 to DA-S4 of the second display surface, respectively. The first to fourth corner adhesive portions UST-M1 to UST-M4 are adhered to bottom surfaces of portions of the second edge portion DM-B that overlap the first to fourth corner surfaces DA-M1 to DA-M4, respectively.

In more detail, according to an embodiment of the inventive concepts, the first adhesive portion UST-S1 and the second adhesive portion UST-S2 are spaced apart from each other in the first direction DR1 with the central adhesive portion UST-U interposed therebetween. In other words, the first adhesive portion UST-S1 extends from a first edge of the central adhesive portion UST-U, and the second adhesive portion UST-S2 extends from a second edge of the central adhesive portion UST-U. The first edge and the second edge of the central adhesive portion UST-U are two sides that face each other in the first direction DR1.

According to an embodiment of the inventive concepts, the third adhesive portion UST-S3 and the fourth adhesive portion UST-S4 are spaced apart from each other in the second direction DR2 with the central adhesive portion UST-U interposed therebetween. In other words, the third adhesive portion UST-S3 extends from a third edge of the central adhesive portion UST-U, and the fourth adhesive portion UST-S4 extends from a fourth edge of the central adhesive portion UST-U. The third edge and the fourth edge of the central adhesive portion UST-U are two sides that face each other in the second direction DR2.

According to an embodiment of the inventive concepts, the first corner adhesive portion UST-M1 is disposed between the first side adhesive portion UST-S1 and the third side adhesive portion UST-S3. In an embodiment, the first corner adhesive portion UST-M1 is cut or separated from the first side adhesive portion UST-S1 and the third side adhesive portion UST-S3. As a result, the display module DM is exposed between the first corner adhesive portion UST-M1 and the first side adhesive portion UST-S1 and between the first corner adhesive portion UST-M1 and the third side adhesive portion UST-S3.

According to an embodiment of the inventive concepts, the second corner adhesive portion UST-M2 is disposed between the first side adhesive portion UST-S1 and the fourth side adhesive portion UST-S4. In an embodiment, the second corner adhesive portion UST-M2 is cut or separated from the first side adhesive portion UST-S1 and the fourth side adhesive portion UST-S4. As a result, the display module DM is exposed between the second corner adhesive portion UST-M2 and the first side adhesive portion UST-S1 and between the second corner adhesive portion UST-M2 and the fourth side adhesive portion UST-S4.

In an embodiment, the first corner adhesive portion UST-M1 and the second corner adhesive portion UST-M2 are symmetrically positioned with respect to the first side adhesive portion UST-S1.

According to an embodiment of the inventive concepts, the third corner adhesive portion UST-M3 is disposed between the second side adhesive portion UST-S2 and the third side adhesive portion UST-S3. In an embodiment, the third corner adhesive portion UST-M3 is cut or separated from the second side adhesive portion UST-S2 and the third side adhesive portion UST-S3. As a result, the display module DM is exposed between the third corner adhesive portion UST-M3 and the second side adhesive portion UST-S2 and between the third corner adhesive portion UST-M3 and the third side adhesive portion UST-S3.

According to an embodiment of the inventive concepts, the fourth corner adhesive portion UST-M4 is disposed between the second side adhesive portion UST-S2 and the fourth side adhesive portion UST-S4. In an embodiment, the fourth corner adhesive portion UST-M4 is cut or separated from the second side adhesive portion UST-S2 and the fourth side adhesive portion UST-S4. As a result, the display module DM is exposed between the fourth corner adhesive portion UST-M4 and the second side adhesive portion UST-S2 and between the fourth corner adhesive portion UST-M4 and the fourth side adhesive portion UST-S4.

In an embodiment, the third corner adhesive portion UST-M3 and the fourth corner adhesive portion UST-M4 are symmetrically positioned with respect to the second side adhesive portion UST-S2.

According to an embodiment of the inventive concepts, a plurality of moving members are coupled to the first to fourth side adhesive portions UST-S1 to UST-S4 and the first to fourth corner adhesive portions UST-M1 to UST-M4, respectively.

For example, according to an embodiment of the inventive concepts, first to fourth moving members CP1, CP2, CP3 and CP4 are coupled to the first to fourth side adhesive portions UST-S1, UST-S2, UST-S3 and UST-S4, respectively. Fifth to eighth moving members CPM1, CPM2, CPM3 and CMP4 are coupled to the first to fourth corner adhesive portions UST-M1, UST-M2, UST-M3 and UST-M4, respectively.

According to an embodiment of the inventive concepts, the first to eighth moving members CP1 to CP4 and CPM1 to CPM4 are respectively coupled to the adhesive portions of the bendable adhesive portion and are displaced in a downward direction opposite to the third direction DR3 to bend the bendable adhesive portion. In this case, since the bendable adhesive portion is bent, the second edge portion DM-B of the display module DM adhered thereto is also bent. According to an embodiment, a curvature of the bent bendable adhesive portion is substantially equal to a curvature of the bent second edge portion DM-B.

Referring to FIG. 5, according to an embodiment of the inventive concepts, the molding member FS is disposed under the adhesive sheet UST to support the adhesive sheet UST.

In detail, according to an embodiment of the inventive concepts, the molding member FS includes a top surface FFS-U that overlaps with the central portion of the display module DM, side surfaces FFS-S bent from the top surface FFS-U that have a curved shape, a pocket FFS filled with a plurality of pressing balls. The molding member FS supports the adhesive sheet UST through the top surface FFS-U. The pressing balls are formed of a magnetic fluid. For example, the magnetic fluid is a Ferro-fluid and includes a ferromagnetic material. Thus, an attractive force forms between the magnet member MN and the pressing balls.

According to an embodiment of the inventive concepts, the display module DM is flexible. However, if the display module DM and the window member WM are pressed by an external roller to bond the display module DM and the window member WM, the display module DM or the window member WM may be damaged or broken. In particular, when the edge portion of the window member WM is bent from the flat portion of the window member WM by an angle of 90 degrees or more, the edge portion of the display module DM may not be bonded to the edge portion of the window member WM using a roller.

However, according to an embodiment of the inventive concepts, the edge portion of the display module DM can be bonded to the edge portion of the window member WM using the attractive forces between the magnet member MN and the magnetic fluid pressing balls.

In more detail, according to an embodiment of the inventive concepts, the pressing balls press the adhesive sheet UST by moving the magnet member MN disposed on the window member WM. Since the adhesive sheet UST is pressed by the pressing balls, the display module DM and the adhesive member AM adhered to the front surface of the display module DM are also pressed. In other words, a space between the window member WM and the adhesive member AM is reduced using the pressing balls, and thus the window member WM and the adhesive member AM can be adhered to each other.

According to an embodiment of the inventive concepts, the pocket FFS seals the pressing balls and is shaped like the side surface shape of the display module DM. The pocket FES is formed of a soft, flexible material such as rubber.

In addition, according to an embodiment of the inventive concepts, the molding member FS includes a plurality of guides GD for molding or forming the second edge portion DM-B of the display module DM. The guides GD are spaced apart from each other in a plan view and are coupled to turners of the pocket FFS, respectively. In particular, the guides GD are shaped to mold the second edge portion of the display module DM.

According to an embodiment of the inventive concepts, each of the guides GD includes a flat surface GD-U that supports the adhesive sheet UST, and first to third curved surfaces GD-M, GD-S1 and GD-S2 that are bent from the flat surface GD-U. The flat surface GD-U corresponds to a top surface of each of the guides GD, and the first to third curved surfaces GD-M, GD-S1 and GD-S2 correspond to side surfaces of each of the guides GD.

According to an embodiment of the inventive concepts, the first curved surface GD-M is disposed between the second curved surface GD-S1 and the third curved surface GD-S2. The first curved surface GD-M has a shape that molds or forms each of the corner surfaces DA-M1 to DA-M4 of the second display surface described above with reference to FIG. 1A. The second curved surface GD-S1 and the third curved surface GD-S2 extend from both ends of the first curved surface GD-M, respectively, and are shaped to mold or form the side surfaces DA-S1 to DA-S4 of the second display surface.

According to an embodiment, the first curved surface GD-M of the guide GD has the same curvature as the first to fourth corner surfaces DA-M1 to DA-M4 of the second display surface described with reference to FIG. 1A. The second and third curved surfaces GD-S1 and GD-S2 of the guide GD have the same curvature as the side surfaces FF-S and of the molding member FS and the first to fourth side surfaces DA-S1 to DA-S4 of the second display surface.

In a present embodiment, the guides GD are coupled to the corners of the pocket FFS. However, embodiments of the inventive concepts are not limited thereto. In other embodiments, the positions at which the guides GD are coupled to the pocket FFS can vary.

Figure 6:
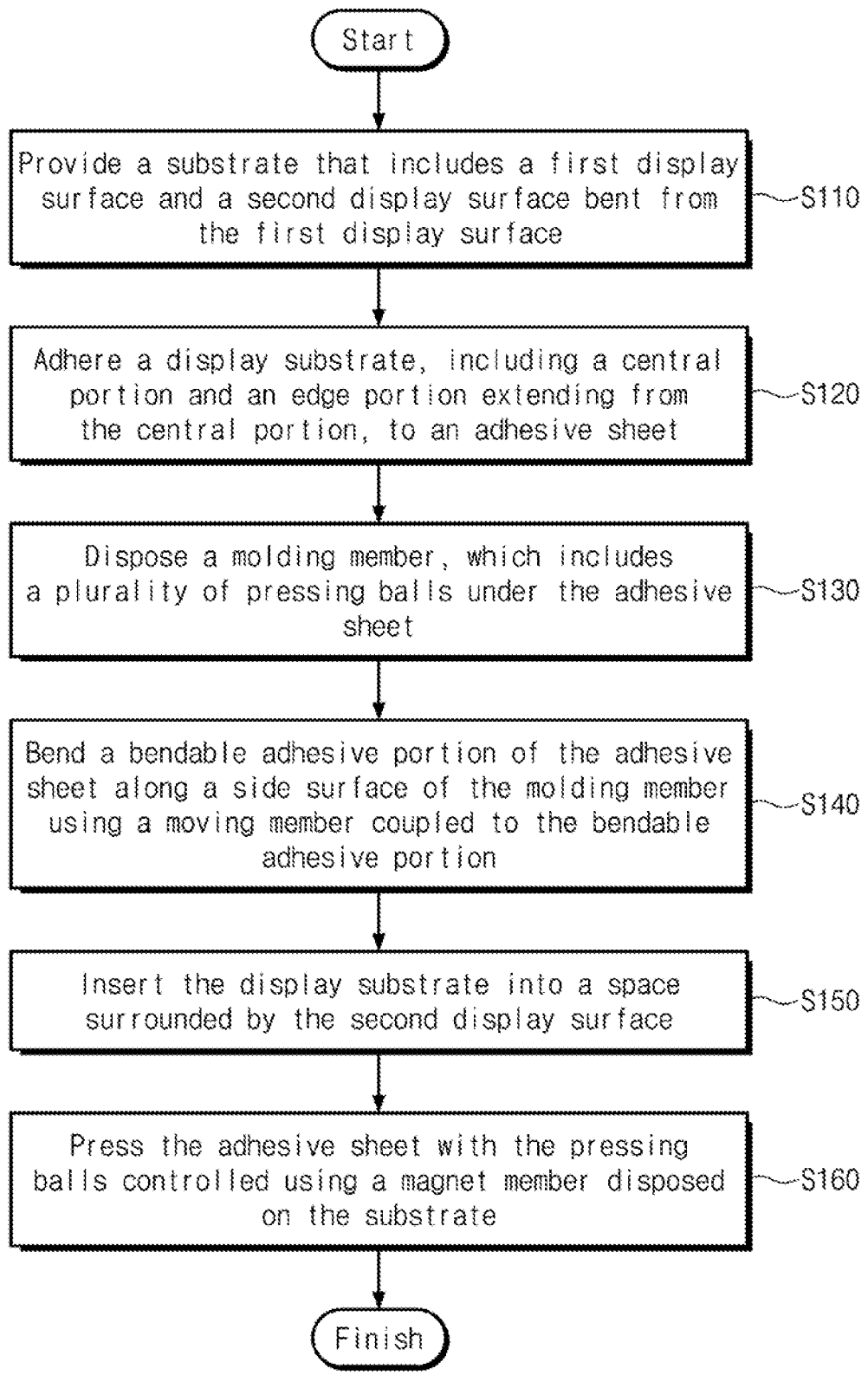
FIG. 6 is a flowchart of a method of bonding a display device using a bonding apparatus according to an embodiment of the inventive concepts.
Figure 7:
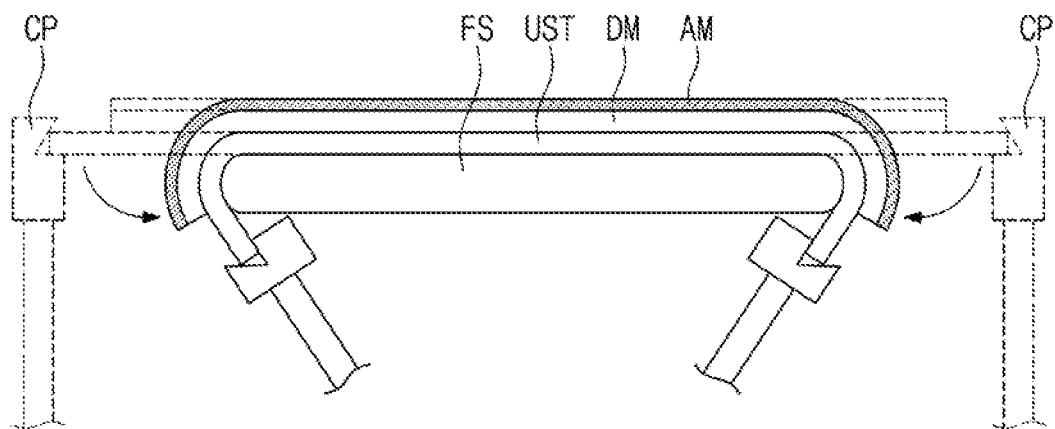
FIG. 7 is a cross-sectional view that illustrates a method of bending a display module, according to an embodiment of the inventive concepts.
Figure 8:
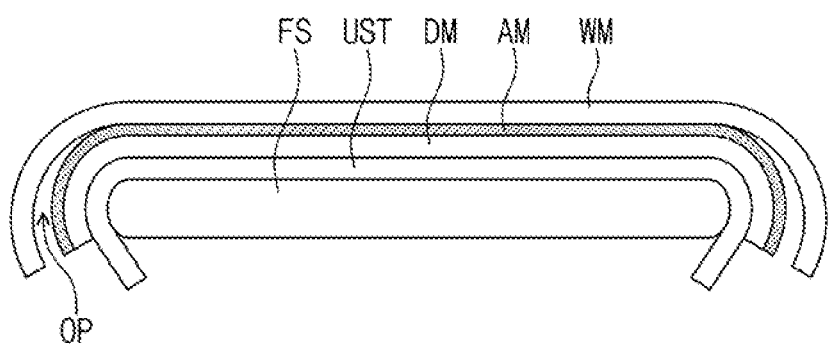
FIG. 8 is a cross-sectional view that illustrates a method of bonding a window member and a display module, according to an embodiment of the inventive concepts.

FIG. 6 is a flowchart of a method of bonding a display device using a bonding apparatus according to an embodiment of the inventive concepts. FIG. 7 is a cross-sectional view that illustrates a method of bending a display module, according to an embodiment of the inventive concepts. FIG. 8 is a cross-sectional view that illustrates a method of bonding a window member and a display module, according to an embodiment of the inventive concepts.

Referring to FIGS. 3 and 6, according to an embodiment of the inventive concepts, a substrate is provided that includes a first display surface and a second display surface bent from the first display surface (S110). The substrate is the window member. The first display surface corresponds to the first flat portion WM-P of the window member WM described with reference to FIG. 2A, and the second display surface corresponds to the first edge portion WM-B of the window member WM.

According to an embodiment of the inventive concepts, a display substrate that includes a central portion and an edge portion extending from the central portion is adhered to the front surface of the adhesive sheet UST (S120). The front surface of the adhesive sheet UST faces the window member WM, and the bottom or rear surface of the adhesive sheet UST faces the molding member FS.

According to an embodiment of the inventive concepts, the display substrate is the display module DM. The central portion corresponds to the second flat portion DM-P of the display module DM described with reference to FIG. 2A, and the edge portion corresponds to the second edge portion DM-B of the display module DM.

According to an embodiment of the inventive concepts, the molding member FS, which includes a plurality of the pressing balls, is disposed on the bottom surface of the adhesive sheet UST (S130). In this case, the molding member FS supports the bottom surface of the adhesive sheet UST.

According to an embodiment of the inventive concepts, the bendable adhesive portion of the adhesive sheet UST is bent along the side surface of the molding member FS using the moving member CP coupled to the bendable adhesive portion (S140). In detail, as illustrated in FIG. 7, since the bendable adhesive portion of the adhesive sheet UST is bent, the adhesive member AM and the display module DM adhered on the bendable adhesive portion are also bent. In particular, the bendable adhesive portion of the adhesive sheet UST is bent along the side surfaces of the guides GD of the molding member FS as described above with reference to FIG. 5.

According to an embodiment of the inventive concepts, the display substrate, such as the display module DM, is inserted into the space OP surrounded by the second display surface of the substrate, such as the window member WM (S150). As illustrated in FIG. 8, the display module DM is inserted into the space OP surrounded by a bent bottom surface of the window member WM that includes the second display surface so as to be bonded to the window member WM. In this case, a portion of the display module DM is adhered to the bottom surface of the window member WM with the adhesive member AM interposed therebetween.

According to an embodiment of the inventive concepts, the adhesive sheet UST is pressed with the pressing balls being controlled by the magnet member MN disposed on the window member WM (S160). In other words, remaining portions of the display module DM and the window member WM, which are not adhered to each other, are adhered to each other with the adhesive member AM interposed therebetween since the adhesive sheet UST is pressed by the pressing balls.

Figure 9A:
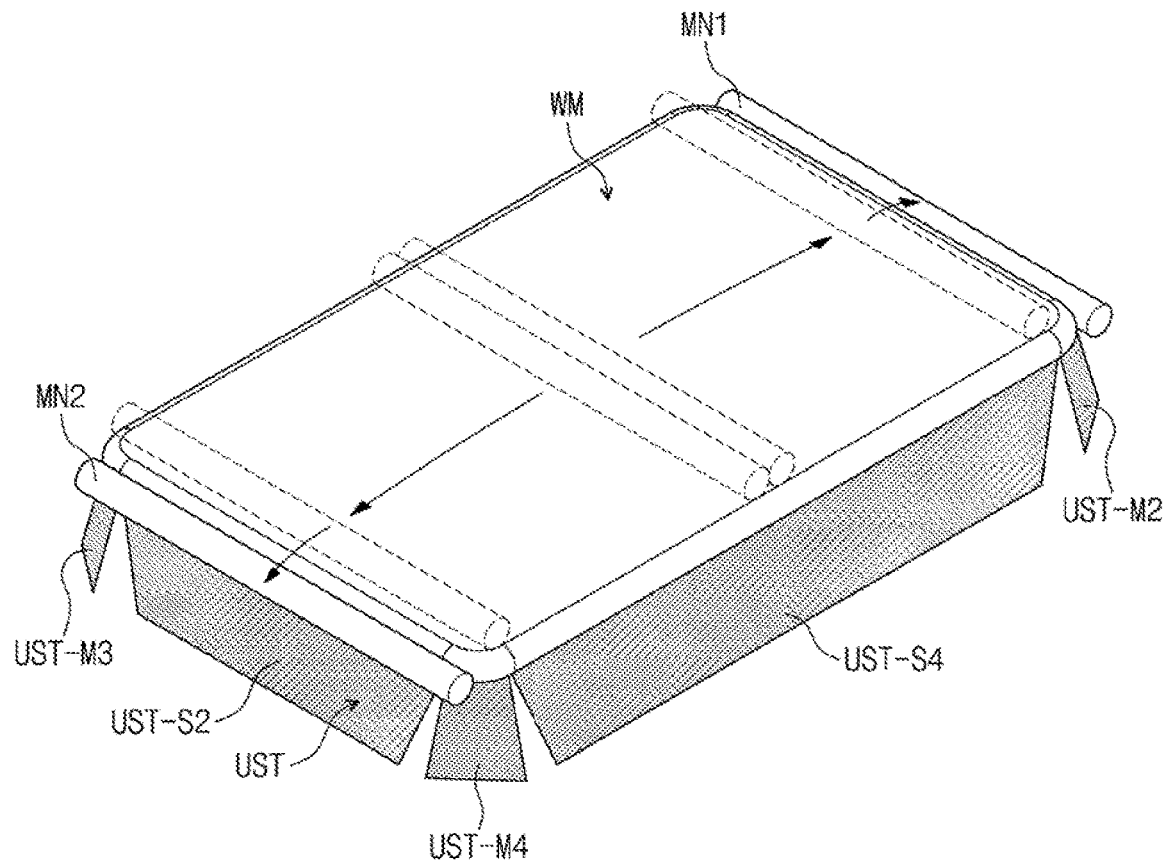
FIGS. 9A and 9B illustrate a method of bonding a window member and a display module on the basis of a first operating mode, according to an embodiment of the inventive concepts.
Figure 9B:
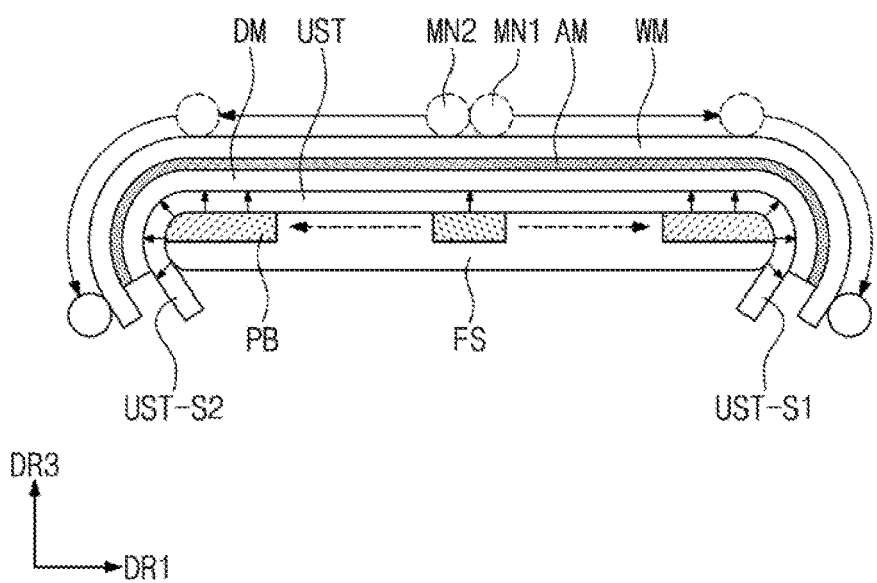
Figure 10:
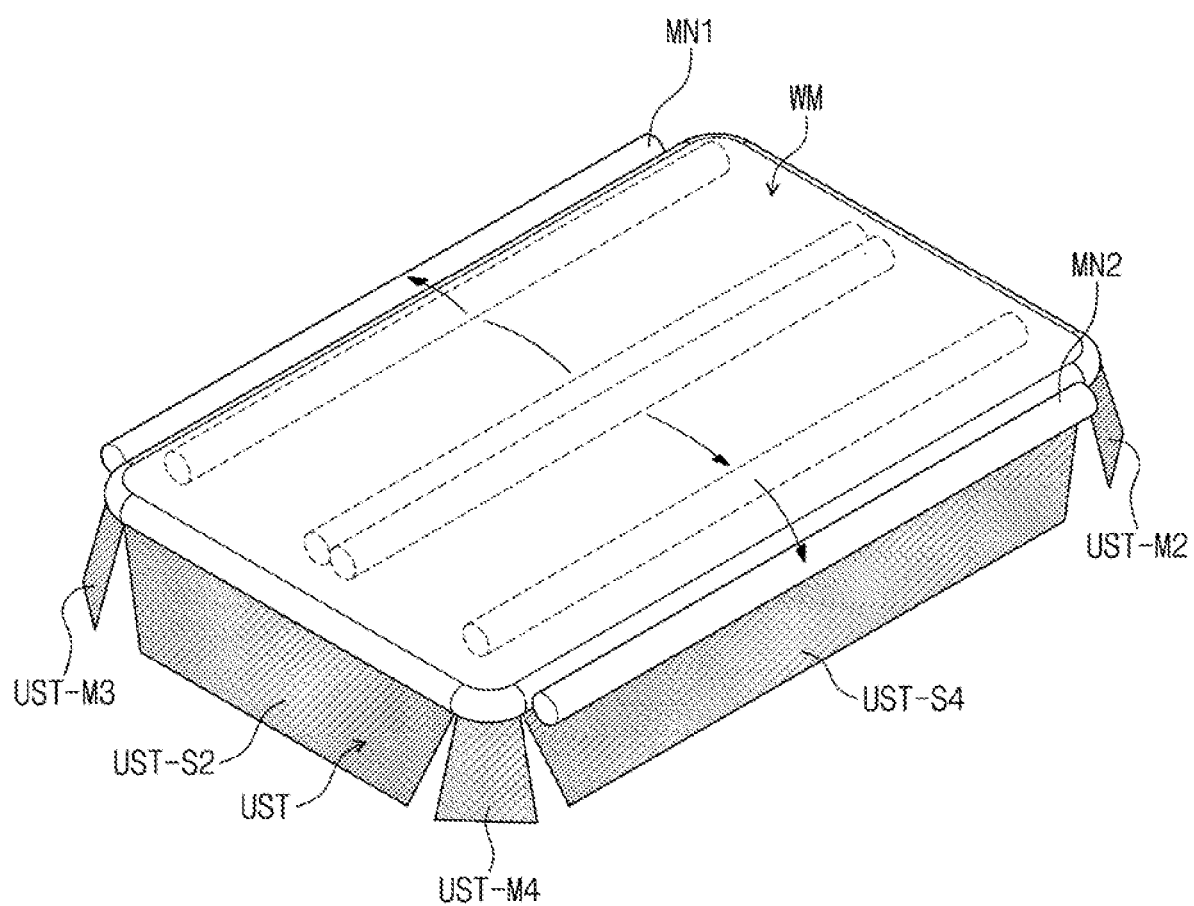
FIG. 10 is a perspective view that illustrates a method of bonding a window member and a display module on the basis of a second operating mode, according to at embodiment of the inventive concepts.
Figure 11:
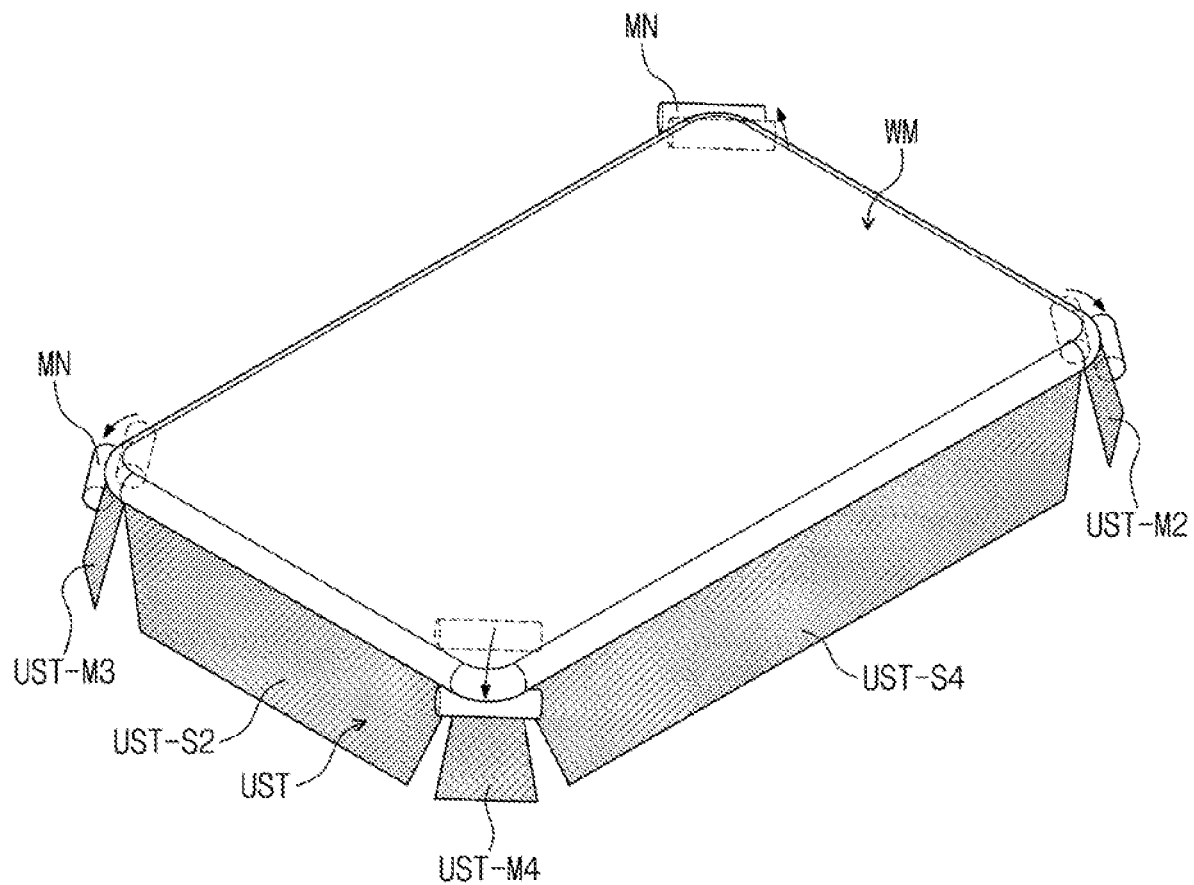
FIG. 11 is a perspective view that illustrates a method of bonding a window member and a display module on the basis of a third operating mode, according to an embodiment of the inventive concepts.

FIGS. 9A and 9B illustrate a method of bonding a window member and a display module on the basis of a first operating mode, according to an embodiment of the inventive concepts. FIG. 10 is a perspective view that illustrates a method of bonding a window member and a display module on the basis of a second operating mode, according to an embodiment of the inventive concepts. FIG. 11 is a perspective view that illustrates a method of bonding a window member and a display module on the basis of a third operating mode, according to an embodiment of the inventive concepts.

According to an embodiment of the inventive concepts, the magnet member MN that forms the attractive forces with the pressing balls PB of the molding member FS is disposed on the window member WM. According to an embodiment of the inventive concepts, the magnet member MN includes a first magnet MN1 and a second magnet MN2.

Referring to FIGS. 9A and 9B, according to an embodiment of the inventive concepts, in a first operating mode, the first magnet MN1 and the second magnet MN2 are disposed on a central portion of the first display surface of the window member WM and then are gradually moved away from each other in the first direction DR1. The first magnet MN1 moves toward the first side adhesive portion UST-S1 of the bendable adhesive portion UST, and the second magnet MN2 may moves toward the second side adhesive portion UST-S2 of the bendable adhesive portion UST.

Referring to FIG. 9B, according to an embodiment of the inventive concepts, each of the first and second magnets MN1 and MN2 forms an attractive force with the pressing balls PB. Thus, the pressing balls PB may also move by the movement of the first and second magnets MN1 and MN2. For example, since the first magnet MN1 moves from the central portion toward the first side adhesive portion UST-S1, the pressing balls PB move toward the first side adhesive portion UST-S1 and press the adhesive sheet UST. The display module DM and the adhesive member AM are also pressed since the adhesive sheet UST is pressed. As a result, an area of the first flat, portion WM-P (see FIG. 2A) of the window member WM is easily adhered to an area of the second flat portion DM-P (see FIG. 2A) of the display module DM.

In addition, according to an embodiment of the inventive concepts, the first magnet MN1 and the second magnet MN2 move onto the first side adhesive portion UST-S1 and the second side adhesive portion UST-S2, respectively. As a result, an area of the first edge portion WM-B of the window member WM is easily adhered to an area of the second edge portion DM-B of the display module DM.

Referring to FIG. 10, according to an embodiment of the inventive concepts, in a second operating mode, the first magnet MN1 and the second magnet MN2 are disposed on a central portion of the first display surface of the window member WM and then gradually move away from each other in the second direction DR2. The first magnet MN1 moves toward the third side adhesive portion UST-S3 of the bendable adhesive portion UST, and the second magnet MN2 moves toward the fourth side adhesive portion UST-S4 of the bendable adhesive portion UST.

In addition, according to an embodiment of the inventive concepts, the first magnet MN1 and the second magnet MN2 move onto the third side adhesive portion UST-S3 and the fourth side adhesive portion UST-S4, respectively. As a result, an area of the first edge portion WM-B of the window member WM is easily adhered to an area of the second edge portion DM-B of the display module DM.

Referring to FIG. 11, according to an embodiment of the inventive concepts, in a third operating mode, a plurality of magnet members MN are disposed adjacent to each of the corners of the window member WM. In detail, the magnet members MN move toward each of the first to fourth corner adhesive portions UST-M1 to UST-M4 of the adhesive sheet UST. As a result, an area of the first edge portion WM-B of the window member WM is easily adhered to an area of the second edge portion DM-B of the display module DM.

In FIGS. 9A, 9B, 10 and 11, according to an embodiment of the inventive concepts, the first to third operating modes are performed separately to bond the first edge portion WM-B of the window member WM to the second edge portion DM-B of the display module DM. However, embodiments of the inventive concepts are not limited thereto. In another embodiment, the first to third operating modes may be performed at the same time on the first edge portion WM-B of the window member WM and the second edge portion DM-B of the display module DM.

According, to the embodiments of the inventive concepts, breakage of the window member and the display module can be prevented when the window member and the display module are bonded to each other.

While embodiments of the inventive concepts have been described with reference to exemplary embodiments thereof, it will be apparent to those skilled in the art that various changes and modifications may be made without departing from the spirits and scopes of exemplary embodiments of the inventive concepts. Therefore, it should be understood that the above embodiments are not limiting, but illustrative. Thus, the scopes of embodiments of the inventive concepts are to be determined by the broadest permissible interpretation of the following claims and their equivalents, and shall not be restricted or limited by the foregoing description.

What is claimed is:

1. A method of bonding a display device, the method, comprising:

providing a substrate that includes a first display surface and a second display surface that surrounds the first display surface and is bent from the first display surface;

adhering a display substrate to a front surface of an adhesive sheet, wherein the display substrate includes a central portion and an edge portion that extends from the central portion and surrounds the central portion in a plan view, and wherein the adhesive sheet includes a central adhesive portion that overlaps the central portion and a bendable adhesive portion that overlaps the edge portion;

disposing a molding member under the adhesive sheet, wherein the molding member includes a plurality of pressing balls and supports the adhesive sheet, wherein the pressing balls include a magnetic fluid that includes a ferromagnetic material;

bending the bendable adhesive portion along a side surface of the molding member using a moving member coupled to the bendable adhesive portion;

inserting the display substrate into a space surrounded by the second display surface;

pressing the central adhesive portion with the pressing balls, wherein the pressing is controlled by a magnet member disposed on the substrate; and pressing the bendable adhesive portion with the pressing balls controlled by the magnet member, wherein the magnet member turns an attractive force with the pressing balls.

2. The method of claim 1, wherein the bendable adhesive portion comprises:
a first side adhesive portion and a second side adhesive portion spaced apart from each other in a first direction with the central adhesive portion interposed therebetween; and
a third side adhesive portion and a fourth side adhesive portion spaced apart from each other in a second direction that intersects the first direction with the central adhesive portion interposed therebetween.

3. The method of claim 2, wherein bending the bendable adhesive portion comprises:
bending the first side adhesive portion and the second side adhesive portion; and
bending the third side adhesive portion and the fourth side adhesive portion.

4. The method of claim 2, wherein the bendable adhesive portion further comprises:
a first corner adhesive portion disposed between the first side adhesive portion and the third side adhesive portion and cut from the first side adhesive portion and the third side adhesive portion, respectively;
a second corner adhesive portion disposed between the first side adhesive portion and the fourth side adhesive portion and cut from the first side adhesive portion and the fourth side adhesive portion, respectively;
a third corner adhesive portion disposed between the second side adhesive portion and the third side adhesive portion and cut from the second side adhesive portion and the third side adhesive portion, respectively; and
a fourth corner adhesive portion disposed between the second side adhesive portion and the fourth side adhesive portion and cut from the second side adhesive portion and the fourth side adhesive portion, respectively.

5. The method of claim 4, wherein bending the bendable adhesive portion farther comprises: bending the first to fourth corner adhesive portions.

6. The method of claim 4,
wherein the magnet member comprises a plurality of magnets disposed adjacent to each corner of the substrate, and
wherein pressing the central adhesive portion with the pressing balls comprises: moving each of the plurality of magnets toward a respective one of the first to fourth corner adhesive portions.

7. The method of claim 2,
wherein the magnet member comprises a first magnet and a second magnet,
wherein pressing the central adhesive portion with the pressing balls comprises:
moving the first magnet toward the first side adhesive portion from a central portion of the first display surface; and
moving the second magnet toward the second side adhesive portion from the central portion of the first display surface; and
wherein pressing the bendable adhesive portion with the pressing balls comprises:
moving the first magnet onto the first side adhesive portion, and
moving the second magnet onto the second side adhesive portion.

8. The method of claim 2,
wherein the magnet member comprises a first magnet and a second magnet, and
wherein pressing the central adhesive portion with the pressing balls comprises:
moving the first magnet toward to the third side adhesive portion from the central portion of the first display surface; and
moving the second magnet toward to the fourth side adhesive portion from the central portion of the first display surface.

9. The method of claim 1, further comprising:
adhering an adhesive member to a front surface of the display substrate,
wherein the pressing balls press the adhesive sheet using the attractive force with the magnet member, such that the adhesive member is adhered to the substrate.

10. The method of claim 1, wherein the molding member comprises:
a pocket that overlaps the first display surface and that is filled with the pressing balls; and
a plurality of guides spaced apart from each other in, a plan view and coupled to corners of the pocket, respectively,
wherein side surfaces of the guides, which face the second display surface, are curved, wherein the second display surface, the edge portion and the side surfaces of the guides have the same curvature.

11. The method of claim 1, wherein the first display surface is curved.

12. A method of bonding a display device, the method, comprising:
adhering an adhesive sheet to first surface of a display substrate, wherein the display substrate includes a central portion, an edge portion that extends from the central portion and surrounds the central portion in a plan view, and a second surface opposite the first surface, and wherein the adhesive sheet includes a central adhesive portion that overlaps the central portion and a bendable adhesive portion that overlaps the edge portion;

bending the bendable adhesive portion along a side surface of a molding member disposed under the adhesive sheet using a moving member coupled to the bendable adhesive portion, wherein the molding member includes magnetic pressing balls;

inserting the display substrate into a space under a window member that is formed by bent edge surfaces of the window member;

disposing a magnet member that includes a first magnet and a second magnet over the window member;

adhering the second surface of the display substrate to the window member by moving the first magnet from a central portion of the window member toward an edge of the window member; and moving the second magnet from the central portion of the window member toward an opposite edge of the window member, wherein each of the first and second magnets forms an attractive force with the magnetic pressing balls.

13. The method of claim 12, wherein the magnet member further comprises a third magnet and a fourth magnet, and adhering the second surface of the display substrate to the window member further comprises moving each of the first to fourth magnets toward a respective corner of the window member.

\* \* \* \* \*